United States Patent [19]

Sexton

[11] Patent Number: 4,542,353

[45] Date of Patent: Sep. 17, 1985

[54] SINE WAVE GENERATOR

[75] Inventor: Daniel W. Sexton, Roanoke, Va.

[73] Assignee: General Electric Company, Salem, Va.

[21] Appl. No.: 558,223

[22] Filed: Dec. 5, 1983

[51] Int. Cl.$^4$ ............................................. H03K 3/02
[52] U.S. Cl. ............................... 331/143; 331/108 D; 331/138
[58] Field of Search ................... 331/108 D, 111, 138, 331/143, DIG. 3, 110; 330/103

[56] References Cited

U.S. PATENT DOCUMENTS 3,936,773  2/1976  Wilkinson .................. 331/108 D X
4,190,808  2/1980  Fajen ......................... 331/108 D X

OTHER PUBLICATIONS

*Operational Amplifiers, Design and Applications*, pp. 381-385.
*Linear Applications Handbook*, National Semiconductor Corporation, 1978, p. AN-37.

Primary Examiner—Eugene R. LaRoche
Assistant Examiner—Robert J. Pascal
Attorney, Agent, or Firm—Arnold E. Renner

[57] ABSTRACT

A sine wave generator circuit for providing, as its output, a substantially perfect sine wave signal includes a multiplier responsive to first input and second input signals of varying magnitude for providing as its output the sine wave signal as a function of the two input signals. There is further included a first feedback circuit path connected between the output and one of the inputs of the multiplier which includes a resistance-capacitance network for providing a phase delayed representation of the output signal as the first of the input signals. The amount of phase delay is determined by the relative values of the resistance-capacitance network and determines the frequency of the sine wave output. Further included is a reference signal the magnitude of which will determine the magnitude of the sine wave output signal. The reference signal is applied to a second feedback circuit path connected between the multiplier output and the other one of its inputs. This second feedback path includes a bridge circuit, for providing an intermediate signal which is proportional to the absolute value of the sine wave output, and an integrating circuit which integrates the difference between the reference signal and the intermediate signal to provide an integrated signal which serves as the second input to the multiplier.

12 Claims, 2 Drawing Figures

SINE WAVE GENERATOR

BACKGROUND OF THE INVENTION

The present invention relates generally to wave shape generators and more particularly to a circuit for generating a sine wave signal.

There are a number of instances which require a signal level sine wave signal. One example of such a requirement is in the discipline of position transducers in which a coil, excited by a electrical signal (e.g., a sine wave), is relatively movable with respect to a core element to provide an output which is representative of some device or apparatus. The accuracy of such transducers is dependent, to a large extent, upon how faithfully the coil exciting signal represents a true sine wave.

There are, of course, a large number of schemes for developing or generating a sine wave signal. As is the case in many disciplines, however, prior art sine wave generators normally represent a compromise between cost and the accuracy of the output signal. One example of such a prior art generator is the so-called Wein-bridge oscillator in which a Wein-bridge resistor-capacitor network is coupled to an operational amplifier the output of which is designed to approximate a sine wave signal. A discussion of Wein-bridge oscillators may be found in the reference *OPERATIONAL AMPLIFIERS Design and Applications*, copyright 1971 by Burr-Brown Research Corporation (Library of Congress Catalog Card Number 74-163297), pages 381 through 385. As is taught by that publication, the greater the need for accuracy of the output signal, the more complex and hence the more expensive and critical the circuit becomes. Generally however, such circuits using operational amplifiers, as well as many other types of circuit elements suffer from saturation effects which result in distortions in the output wave form, particularly in the form "clipping" of the output signal. By clipping is meant that the output signal tends to have a flat portion at its peak rather than a true sine wave representation.

SUMMARY OF THE INVENTION

It is, therefore, an object of the present invention to provide an improved sine wave generator.

It is a further object to provide a wave shape generator which provides a true sine wave output signal.

It is another object to provide an improved sine wave generator which may be economically manufactured.

It is a still further object to provide an improved sine wave generator which is comprised of linear components.

It is an additional object to provide an improved sine wave generator which employs a linear analog multiplier.

The foregoing and other objects are achieved, in accordance with the present invention, by providing a two input linear multiplying means which receives a first input signal which is a phase delayed representation of the sine wave output signal. The second input signal is the integrated result of the difference between a reference signal of prescribed value and a signal which is proportional to the absolute value of the sine wave output signal. The linear aspects of the analog multiplying means provides, as a function of the product of the two input signals, a sine wave output signal which is substantially perfect.

BRIEF DESCRIPTION OF THE DRAWING

While the present invention is defined in particularity in the claims annexed to and forming a part of this specification, a better understanding of the invention may be had by reference to the following description taken in conjunction with the accompanying drawing in which:

DETAILED DESCRIPTION

Figure 1:
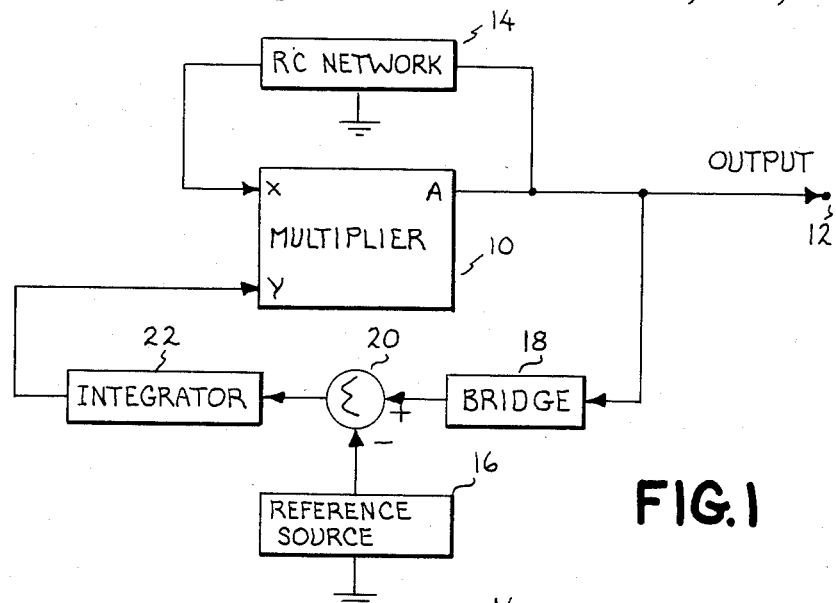
FIG. 1 is a block diagram illustrating the sine wave generator of the present invention in its preferred embodiment; and, FIG. 2 is a schematic diagram illustrating one method of implementing the invention as depicted in FIG. 1.

Reference is now made to FIG. 1 which shows the preferred embodiment of the present invention in block form. A multiplying means or multiplier 10 is provided with two input terminals, an X terminal and a Y terminal, for receiving input signals and an output terminal A which provides an output signal which is the function of the product of the two inputs to the X and Y input terminals. The signal at the output terminal A, as seen at output terminal 12, is the sine wave output in accordance with the present invention. Connected in a first feedback path between the output terminal A and a first of the input terminals; e.g., the X input terminal, is a resistance-capacitance (RC) network 14 which is referenced to a system common voltage (e.g., ground). The network 14 furnishes a first input signal to the multiplier 10 (X terminal) which is, essentially, the signal at the output terminal A, but phase delayed with respect thereto. The amount of delay is proportional to the RC time constant of the network 14.

A reference source 16, which may be of any suitable type such as an operator setable voltage source, supplies a negative signal to a summing junction 20. The value of the signal from the reference source 16 determines the magnitude of the output of the multiplier 10.

The rest of the depiction in FIG. 1, taken in conjunction with the summing junction 20, comprises a second feedback path connected between output terminal A of the multiplier 10 and its Y input. This feedback path includes a bridge circuit 18 which may be a full or half wave rectification bridge. Bridge circuit 18 provides an intermediate output signal which is proportional to the absolute magnitude of the signal at terminal A. Preferably, the output signal from bridge 18 is proportional to the absolute magnitude of the average value of the output signal at terminal A. The output of bridge circuit 18 is applied in the positive sense to summing junction 20 which receives, as its second input, the reference signal from the source 16. The output of summing junction 20 is a signal which is the difference between its two inputs and is supplied to an integrating circuit (integrator) 22. Integrator 22 may be of any suitable type and provides, as its output, the integral of the difference signal from junction 20 which serves as the input to the Y terminal of multiplier 10.

In operation, the output A of multiplier 10 is a function of the product of the signals applied to the X and Y input terminals. Because of the delaying nature of the RC network 14, and by virtue of the fact that there is applied to the Y terminal the integral of a function of the output, it can be shown that the output of the multiplier is a pure sine wave so long as the multiplier remains linear. Thus, the objective of the present invention has been achieved.

Figure 2:
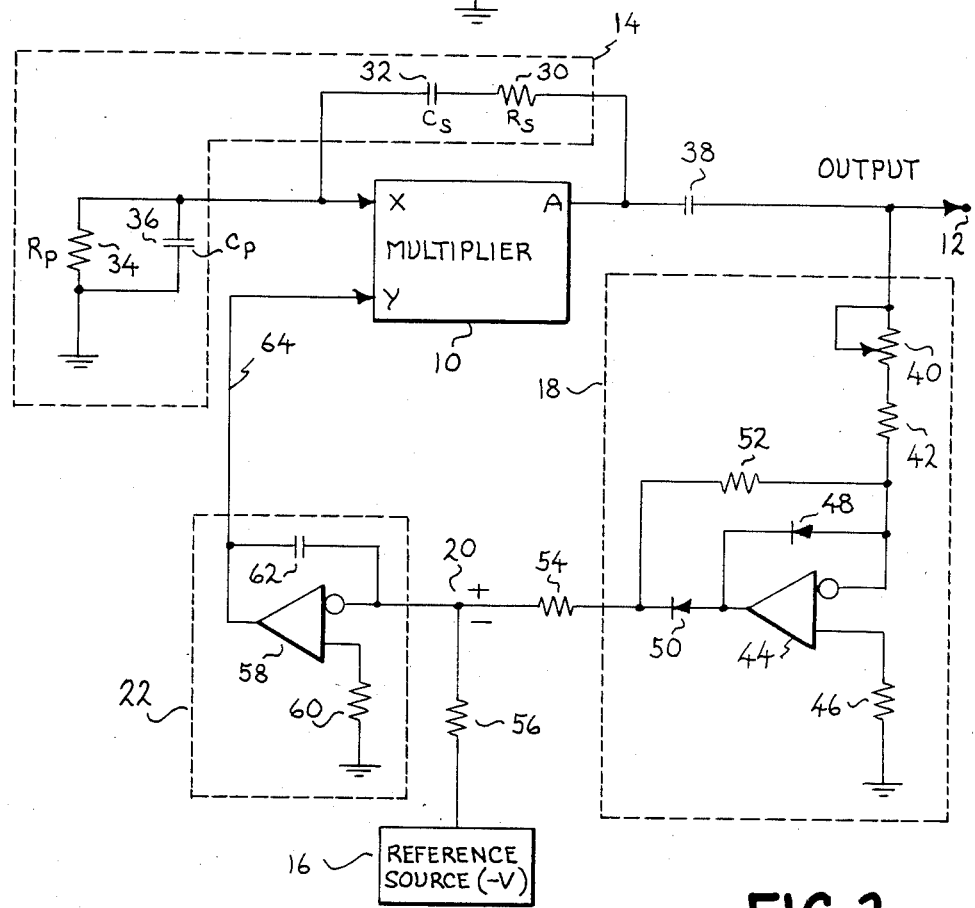

While there are a number of ways of achieving the several individual functions specified in FIG. 1, FIG. 2 illustrates one particular possible embodiment. As shown in FIG. 2, a multiplying means or multiplier 10 is again depicted. This multiplier is preferably of the analog type such as that sold by Analog Devices of Norwood, Mass. and designated by it as an AD534. The RC network 14 as shown in FIG. 2 includes a series combination of a resistor 30, having a resistance value $R_s$, and a capacitor 32 having a capacitance value $C_s$. This series combination is connected between the output A and the X input of multiplier 10. A second resistor-capacitor combination, comprised of a resistor 34 (having a resistance $R_p$) connected in parallel with a capacitor 36 (having a capacitance $C_p$) is connected between the X input of multiplier 10 and a system common (e.g., ground).

A capacitor 38 is connected between the output terminal A of the multiplier 10 and the ultimate output terminal 12 to eliminate dc components from the output signal.

Terminal 12 is further connected to bridge circuit 18 shown in FIG. 2 as a half wave bridge. The signal at output terminal 12 is applied by way of a variable resistor 40 and a fixed resistor 42 to the inverting input of an operational amplifier 44 the non-inverting input of which is connected to ground by way of a resistor 46. A diode rectifier 48 is connected between the inverting input and the output of the amplifier 44 in a direction to pass negative signals from the output to the inverting input. A second diode 50 is connected to the output amplifier 44 in a direction so as to pass only positive signals being emitted from that amplifier. Further included within the bridge, connected between the inverting input of amplifier 44 and the anode of diode 50 is a resistor 52. The output of bridge circuit 18, a positive signal proportional to the average of the absolute magnitude of the output signal appearing at terminal 12, serves via resistor 54 as one input to summing junction 20.

The second input to summing junction 20 is from a reference source 16 which is shown in FIG. 2 as providing a negative voltage ($-V$) by way of a resistor 56 to that junction. The output of junction 20, a signal representing the difference between its two inputs is applied to the inverting input of an operational amplifier 58 which has its non-inverting input connected to ground by way of a resistor 60. Amplifier 58, with its associated circuitry which further includes a capacitor 62 connected between its inverting input and its output, comprises an integrating circuit 22 which furnishes, as its output, a signal which is the integral of the difference signal input. This integrated signal is applied by way of line 64 to the Y input terminal of multiplier 10.

Since there is a one-to-one correlation between FIG. 2 and FIG. 1 the operation of FIG. 2 is identical as that earlier explained. By way of further explanation, however, the frequency (f) of the sine wave generator of FIG. 2 is defined by the relationship:

$$f = \frac{1}{2\pi \sqrt{R_s C_s R_p C_p}}$$

Thus, by varying the values of the resistive and/or capacitive components of the RC network 14, the output frequency of the sine wave generator may be controlled. As was earlier indicated, the magnitude of the output sine wave can be controlled by controlling the value of the voltage from the reference source 16.

Thus, it is seen that there has been described a relatively simple and inexpensive circuit for providing an essentially pure sine wave output signal.

While there has been shown and described what is at present considered to be the preferred embodiment of the present invention modifications will readily occur to those skilled in the art. For example, while the depiction in FIG. 2 illustrated a half wave rectification bridge it is apparent that a full wave bridge such as shown in FIG. A of page 249 of the aforementioned reference *OPERATIONAL AMPLIFIERS Design and Application* would work with equal facility. In addition, it should be noted that the reference signal need not be of a fixed value but could be variable as a function of some external parameter. This would result in an output sine wave signal which is amplitude modulated in accordance with the variation of the reference signal. It is not desired, therefore, that the invention be limited to the specific apparatus shown and described and it is intended to cover in the appended claims all such modifications as fall within the true spirit and scope of the invention.

What is claimed:

1. A sine wave generator circuit, for generating a sine wave output signal, comprising:
   (a) multiplying means including first and second input terminals for receiving, respectively, first and second input signals of varying magnitude and further including an output terminal for providing said sine wave output signal as a function of the product of said first and second input signals;
   (b) a first feedback circuit connected between said output terminal and said first input terminal for providing said first input signal, said first feedback path including circuit elements for providing a phase delayed representation of said output signal and serving as said first input signal, said circuit elements having selectable electric values which determine the amount of phase delay to thus determine the frequency of said output signal;
   (c) means to provide a reference signal having a prescribed value; and
   (d) a second feedback circuit connected between said output terminal and said second input terminal for providing said second input signal, said second feedback circuit including,
      (1) means to provide an intermediate signal proportional to the absolute magnitude of said output signal,
      (2) means to combine said intermediate signal and said reference signal to provide a difference signal, and,
      (3) means to integrate said difference signal to thereby develop said second input signal.

2. The invention in accordance with claim 1 wherein said first feedback circuit includes a resistance-capacitance network for providing the phase delayed representation of said output signal.

3. The invention in accordance with claim 2 wherein said resistance-capacitance network includes a series connected combination of a resistor and a capacitor connected between said output terminal and said first input terminal and a parallel connected combination of a resistor and a capacitor connected between said first input terminal and a system common voltage.

4. The invention in accordance with claim 3 wherein the frequency (f) of said sine wave output signal is defined by the relationship:

$$f = \frac{1}{2\pi \sqrt{R_s C_s R_p C_p}},$$

wherein, $R_s$, $R_p$, $C_p$ and $C_p$ are, respectively, the resistance and capacitance values of the resistors and capacitors of said series and parallel connected combinations.

5. The invention in accordance with claim 4 wherein said sine wave output signal has a magnitude proportional to the value of said reference signal.

6. The invention in accordance with claim 1 wherein said means to provide said intermediate signal includes a bridge circuit operable to develop said intermediate signal as a function of the average absolute magnitude of said output signal.

7. The invention in accordance with claim 1 wherein said multiplying means comprises an analog multiplier.

8. The invention in accordance with claim 1 wherein said means to promote said intermediate signal comprises an operational amplifier bridge circuit for providing, as said intermediate signal, a signal having a value proportional to the average of the absolute value of said output signal.

9. A sine wave generator for developing a sine wave output signal of controllable frequency and magnitude comprising:
   (a) a linear analog multiplier responsive to first and second input signals to generate said output sine wave signal;
   (b) a frequency feedback path including a resistance-capacitance network responsive to said output sine wave signal for developing said first input signal, the resistance and capacitance values of said network determining the frequency of said output signal;
   (c) means to provide a reference signal the value of which determines the magnitude of said output sine wave signal; and
   (d) a second feedback path for developing said second input signal, said feedback path including;
      (1) a bridge circuit for developing an intermediate signal proportional to the absolute magnitude of said output sine wave signal,
      (2) means to combine said reference signal and said intermediate signal to develop a difference signal proportional to the difference therebetween, and
      (3) means to integrate said difference signal to thereby develop said second input signal.

10. The invention in accordance with claim 9 wherein said resistance-capacitance network includes a series connected combination of a resistor and a capacitor connected between said output terminal and said first input terminal and a parallel connected combination of a resistor and a capacitor connected between said first input terminal and a system common voltage.

11. The invention in accordance with claim 10 wherein the frequency (f) of said sine wave output signal is defined by the relationship:

$$f = \frac{1}{2\pi \sqrt{R_s C_s R_p C_p}}$$

wherein, $R_s$, $R_p$, $C_s$ and $C_p$ are, respectively, the resistance and capacitance values of the resistors and capacitors of said series and parallel connected combinations.

12. The invention in accordance with claim 9 wherein said bridge circuit develops said intermediate signal as a function of the average of the absolute magnitude of said output sine wave signal.

* * * * *